United States Patent [19]

Flormann et al.

[11] 4,035,734
[45] July 12, 1977

[54] NOISE SUPPRESSION IN MEASURING SIGNALS

[75] Inventors: Paul Flormann, Heiligenhaus; Egon Hinneman, Kettwig; Bernhard Mengelkamp; Arno Elsner, both of Heiligenhaus, all of Germany

[73] Assignee: Hartman & Braun Aktiengesellschaft, Frankfurt am Main, Germany

[21] Appl. No.: 630,019

[22] Filed: Nov. 7, 1975

[30] Foreign Application Priority Data

Oct. 12, 1974   Germany .......................... 2448779

[51] Int. Cl.² ............................................ H04B 3/02
[52] U.S. Cl. ................................. 328/167; 328/127; 328/171; 307/360

[58] Field of Search .......... 328/165, 169, 171, 127, 328/167; 307/235 N

[56] References Cited

U.S. PATENT DOCUMENTS

| | | | |
|---|---|---|---|
| 2,931,901 | 4/1960 | Markusen | 328/167 |
| 3,566,285 | 2/1971 | Schroeder | 328/169 |
| 3,656,043 | 4/1972 | Itawada et al. | 328/171 |
| 3,701,028 | 10/1972 | Markevich | 328/167 |

Primary Examiner—John S. Heyman
Attorney, Agent, or Firm—Ralf H. Siegemund

[57] ABSTRACT

Measuring signals are compared with an output of an integrator, and the difference is fed to a threshold device having suppression ranges corresponding to the noise band. The threshold device output drives the integrator. The suppression ranges are controlled in response to actual and/or anticipated noise.

2 Claims, 5 Drawing Figures

NOISE SUPPRESSION IN MEASURING SIGNALS

BACKGROUND OF THE INVENTION

The present invention relates to a circuit for noise suppression in measuring signals.

The German Patent GermanPatent No. 2,118,812 describes a device for forming the mean value of signals representing statistically occurring events. This known device is contructed as follows: The measuring signal is fed to a differentiating circuit which controls a signal monitoring circuit. This monitoring circuit determines whether a change in the input signal (time derivative) is zero or not zero. The monitoring circuit has a two channel output respectively connected to two function generators, and one or the other is actuated depending on the outcome of the zero/non-zero test.

One of the function generators, generall, produces a function $x = f(t)$ and the other one the function $x = f$ $x = f(dU_i/dt)$, wherein $U_i$ is the input signal. The values for $x$ (in either case) are used to control an integrator via a differential amplifier, but not as input to be integrated. The integrator has a time constant $\tau$ which is controlled in dependence upon $x$, so that for $x = f$ $(dU_i/dt)$ the value of $\tau$ is reduced, and for $x = f(t)$ the value for $x$ is increased. The input proper for the integrator is $U_i$ itself and the integrator furnishes a signal $U_o - \int U_i$. The differentiator, the monitor and the function generators are connected in a feedback loop of the device via the differential amplifier.

The above-mentioned patent discloses also a second embodiment in which the differentiating circuit is replaced by a second differential amplifier, forming the difference between the signals $U_i$ and $U_o$.

The known device, in either configuration, works in that for large changes in the input signal $U_i$ the integrator operates automatically with a small time constant, but with a large time constant for small input changes. In either case, the device operates with a finite time constant. It was found that this feature amounts to a drawback in that for a sudden change in the input (step function) the output changes rather slowly by an e-function so that the indicated value deviates from the true value for the input.

DESCRIPTION OF THE INVENTION

It is an object of the present invention to provide for a new and improved device for suppressing and rejecting noise that is superimposed upon a measuring signal.

It is another object of the present invention to provide for enhencement in the response of a measuring circuit under suppression of statistically distributed noise signals.

It is a specific object and feature of the present invention to adopt the use of an integrator and of a difference forming device in feedback for purposes of noise suppression from measuring signals.

In accordance with the preferred embodiment of the invention, it is suggested to provide the output of the difference forming circuit representing the difference between measuring signal and integrator output, to a bidirectionally effective threshold device which has progessingly increasing passage ranges with little or no passage for difference amplitudes corresponding to the amplitude band width of the noise. The output of the threshold device is the input to the integrator and is adjusted to a mean value (e.g. zero) by operation of the feedback loop.

The threshold device when controlled for signal passing by operation of a larger-than-noise signal change produces a very large output at first, so that the integrator is run up or down quite rapidly tending to equalize the other input of the difference forming device, which is the measuring signal that had just changed. Thus, the integrator output tracks very rapidly the measuring signal. If the measuring input changes only by a small amount, possibly even smaller than the noise band width, such input change for the threshold device causes an imbalance in the threshold output as far as noise peaks in the same direction as the change of the measuring component in the input signal is concerned. These noise peaks will be integrated and zero balance as between the measuring component and the integrator output will be restored.

Rapid changes in the measuring signals are always tracked without delay, as stated above; slow changes are approximated by step functions generated as such also without delay, whereby specifically the imbalance in the transmission of noise by the threshold device is instrumental in the formation of the steps of the approximation.

DESCRIPTION OF THE DRAWING

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 shows an integrating amplifier 1 constructed as Miller integrator. A threshold device 2 is provided ahead of the input of integrator 1. The threshold device 2 receives its input from an algebraic summing point (e.g. a differential amplifier) 3. The first input for the summing point 3 is an input signal I which is a measuring signal derived e.g. from an ionization chamber serving as measuring detector or transducer. The signal I is composed of an information containing component or true measuring signal and of noise which is superimposed upon the true signal and info-component.

Figure 1:
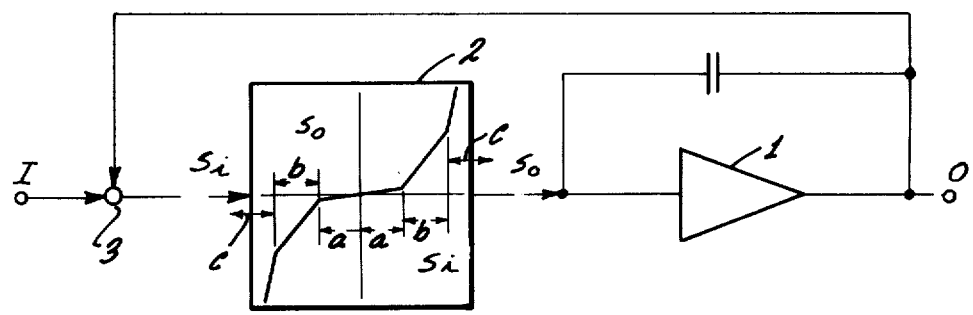
FIG. 1 is a block diagram of a relatively simple example for practicing the preferred embodiment of the invention.

The second input for summing point 3 is the output signal O of the integrator 1. Thus, summing point 3 compares the input signal I with the 180° phase-shifted output signal O. The result is a difference $S_t$ which is fed to threshold circuit 2. This difference signal $S_t$ is, therefore composed of the true information signal from which the integrator output is subtracted (or vice versa), and the noise is superimposed, because the integrator output is substantially free from noise.

The threshold device 2 is, basically, a network of linear and non-linear circuit elements with a progressively changing transfer characteristics, being symmetrical to the zero point of input and output. The output of the threshold device is denoted $S_o$. The transfer characteristics could be written as $S_o = F(S_t)$ and is characterized as follows:

Basically, it has three transfer or gain ranges for each polarity of signals $S_t$. The outer range(s) are operative for large $S_t$ and exhibit large gain. In other words, the output signal $S_o$ varies significantly for small changes of $S_t$ in that range denoted $c$. For small signals $S_t$ the output signal $S_o$ remains near zero, but the gain may, nevertheless be non zero. However, as will become apparent below, the gain may be practically or completely zero in that lowest range, denoted $a$. The intermediate range of the characteristics, denoted $b$, has a non zero gain, but the gain is smaller than the gain for the outer range. In summary, $S_o >> S_t$ for the outer range; $S_o <> S_t$ for the inner range and $S_o$ is of the same order of magnitude, possibly even equal to $S_t$ in the intermediate range. The ranges $a$ and $b$ may be of equal width. The signal $S_o$ is integrated in the integrator 1.

By way of example, device 2 may be composed of two sets of two parallelly operating amplifiers, each. The two sets may be provided for the two different polarities of the signal $S_t$. One amplifier of each set has the intermediate gain with a threshold cutoff for inputs below amplitude level $a$. The other amplifier in the set may have a high gain, but with a cut off threshold for inputs below range $b$. The outputs of all four amplifiers are summed to provide for a common output terminal, which is connected to the integrator 1.

The speed of response of the integrator is really the result of an interplay between a small time constant (high gain integrators) for the integrator per se and a high gain for signal range $c$. Small time constant and high gain reinforce each other, so that for reasons of stability neither gain needs to be excessive.

The device operates as follows:

If the input signal I varies and undergoes a relatively large change, then the signal $S_t$ reaches the outermost range of the characteristics of threshold device 2 and a rather large signal $S_o$ is applied to the integrator which runs up (or down) rapidly to equal the input signal I. This operation corresponds to a very small time constant and results in faithful tracking of the input with little or no delay thereby covering most or a significant portion of the change.

When the signal difference $S_t$ lies in the median range, then the time constant is rather large and the integrator changes its output considerably slower. As the signal difference $S_t$ drops to within the lowest range of device 2, hardly any or even no output is effective on the integrator. Now, however, it must be considered that the noise plays actually an active part in the operation.

The width of the lowest range $a$ is selected to be equal to the noise level in the signal. The noise level is usually defined as the root mean square value of the noise fluctuations. Thus, individual noise peaks still enter medium ranges $b$, even if the information signal component in input I equals exactly the integrator output O. However, the slow response of the integrator to these peaks coupled with statistical distribution of both polarities of such noise peaks in the signal $S_t$ amounts to a de facto elimination of the noise.

The situation is different, if the information component in input I differs from the integrator output. In this case, the balance is distributed as the zero level for the noise is shifted asymmetrical to the symmetrical characteristics of device 2. Assume the case above, that the information signal had changed and the integrator was changed accordingly by operation of the outer range C. Now the integrator output may have changed, so that the difference between it and the information signal component of signal I has diminished so that the corresponding info-component in difference signal $S_t$ is at or near the boundary between ranges $b$ and $c$. This component in the difference signal $S_t$ is the zero level for the noise, and the noise peaks to one side reach into range C, while noise peaks towards the other side reach in $b$ or even $a$. Thus, the noise is transmitted by device 2 with a significant gain difference as to the two polarities amounting to a rather strong non-zero component, which is integrated. This contributes to causing the feedback to continue to reduce $S_t$ further. This means that the feedback works with hardly any delay until the information component portion in signal $S_t$ is below the boundary of ranges $b - a$. Even then — asymmetry of noise integration continues, though at a less steep rate as only range $b$ participates, but the feedback loop continues until the information component in $S_t$ is zero, and signal $S_t$ consists of pure noise which is totally suppressed because of average balance in the low gain range resulting in little or no fluctuation of the integrator input which in turn maintains a stable output. The transfer characteristic of range $b$ if processing noise peaks is equivalent to a sufficiently high time constant for the integrator to serve still fully as noise rejector.

The device operates also satisfactorily for slow changes in the information signal. The difference signal $S_t$ (info-component) will shift slowly until noise peaks reach the boundary $b - c$ and rapid integration of the noise peaks in range $c$ causes the output of the integrator to perform a step reducing the difference signal $S_t$ so that the noise peaks no longer reach range $c$. As the gradual change in the information component of I continues, it increases the difference signal $S_t$ again, so that the noise peaks project again above the boundary $b - c$, etc. This way, one obtains a stepwise tracking of the measuring signal which occurs the more rapid the smaller one chooses range $b$. However, it is important that this range be not too small for reasons of stability.

Figure 2:
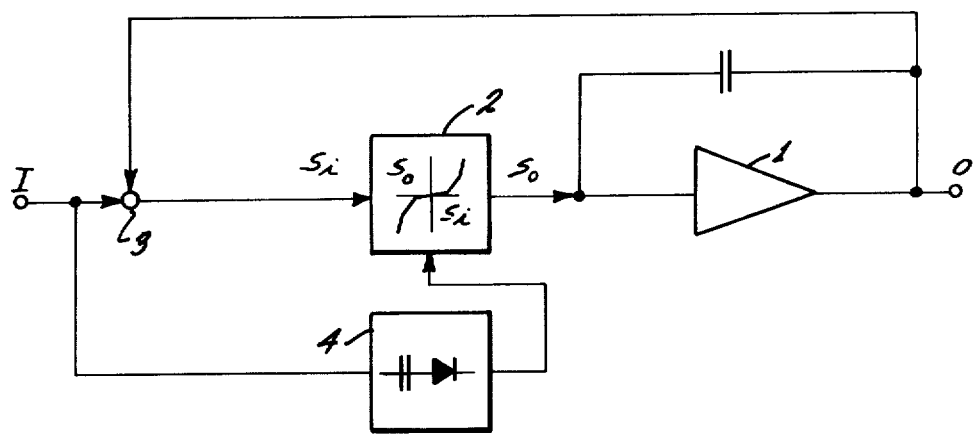
FIG. 2 is a block diagram of an improved example.

FIG. 2 includes all of the components shown in FIG. 1, but is supplemented by a feed-forward circuit for purposes of control. The feed-forward circuit is connected to receive input signal I and includes a noise detector 4 constructed as high pass filter with output rectifier to form a d.c. signal, which represents the average noise level. That signal is used to control a variable resistance-type device or devices in threshold circuit 2, which spreads or narrows the width of the low gain range $a$, so that the signal suppression range is increased with the noise level. The width of the intermediate range $b$ may also be controlled. By way of example, if the ranges are established by input cut off thresholds, a threshold level therein may be established by a semi-conductor element which is non-conductive for signals below a certain amplitude and causes them to be suppressed. High pass 4 will control the bias of such element to vary its transmission to thereby vary the threshold level of the device. As stated, the device 2 may be composed (for each polarity of $S_t$) of a high gain amplifier with large threshold (b) and a medium gain amplifier with small threshold (a). The threshold level may be established in each instance by bias of a series semi-conductor to remain cut off for signals below levels $a$ or $b$. The high pass rectifier will control that bias to change the cut off range $a$ and $b$, thereby varying the boundaries between the ranges $a$, $b$ and $c$.

By increasing, generally, the suppression range (and, possibly, the median gain range) one may lose some response as far as information signal changes is concerned, but the noise suppression is better while on the other hand a low noise level will increase the overall response to the permissible optimum.

It should be noted that circuit 4 should include some integration of the noise to obtain a more or less steady level. The longer the time constant of integration, the steadier will be the level of the signal that is used for control of the threshold device 2. However, any change in noise level is somewhat sluggishly detected while short term integration is faster in response to a change in noise level but produces more frequent changes in the threshold band control.

Figure 3:
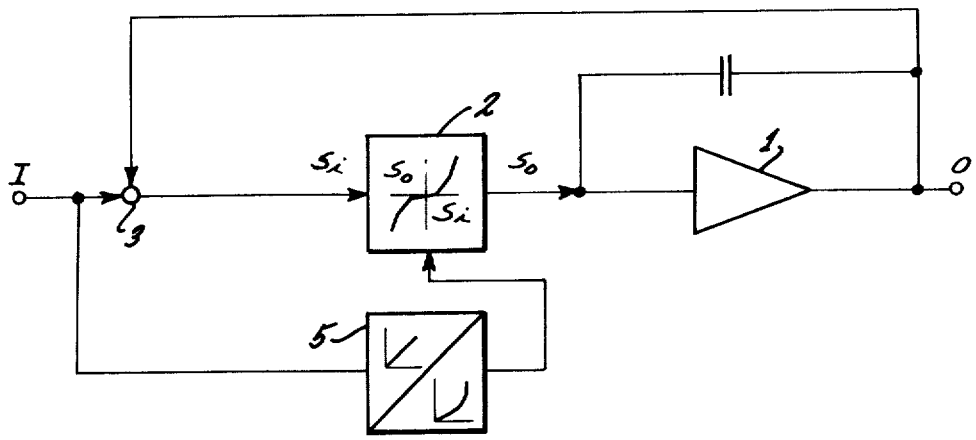
FIG. 3 is a block diagram which includes a different improvement.

FIG. 3 is an alternative modification. Again, it includes all of the elements of FIG. 1. Also, the circuit is provided with a feed-forward circuit which in this instance includes a function generator 5. The generator 5 responds to the input signal, possibly through low pass filtering to ascertain the signal level. One can also consider the generator or a part thereof as a signal level detector.

The purpose of the generator 5 is to provide a representation for the noise level to be expected. In some instances e.g. for some types of measuring signals and for some conditions under which the measuring signal is generated as an input, there is a functional relation between signal level or amplitude and noise. An example here is the field of nuclear radiation technique. The generator 5 duplicates that relation and provides an output representative of the expected noise amplitude band. That signal e.g. a d.c. control signal is used for controlling the width of the low gain range in theshold circuit 2. In the most simple form, the functional relation may be linear, but in other cases the relation may be non-linear (as depicted). In such a case the threshold band(s) of the device 2 is controlled accordingly. Of course, the control as provided in that manner must take into consideration that anticipated noise may be deviating to some extent from the actual noise, so that the control should be moderate to avoid undue restriction in the response of the circuit as a whole.

Figure 4:
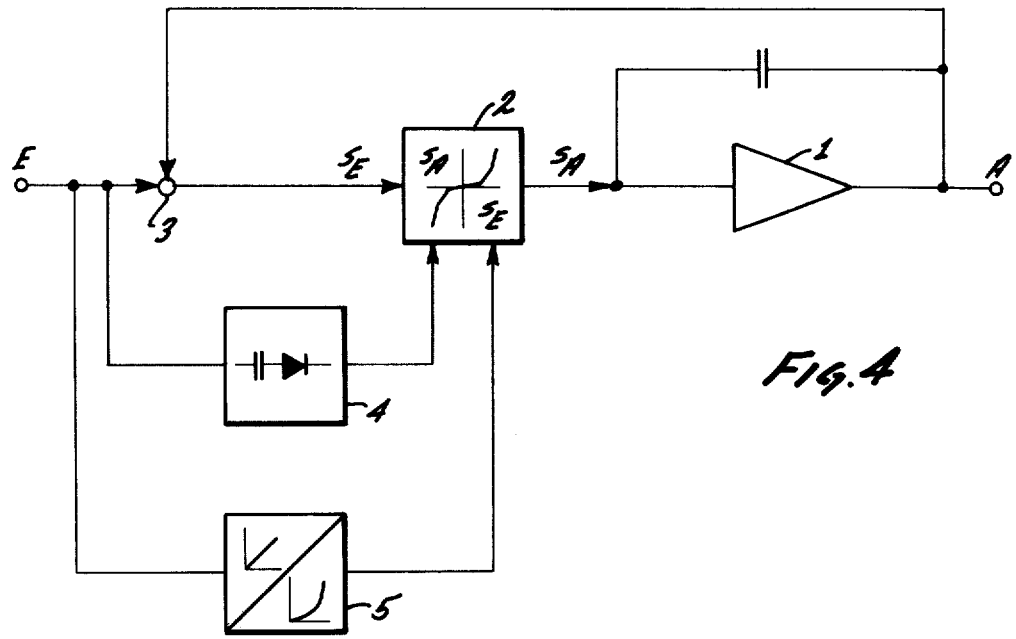
FIG. 4 is a block diagram of the best mode of practicing the preferred embodiment.

FIG. 4 shows that both methods of range control for noise suppression can be used. Here, the generator 5 may provide for the principal noise suppression range control in threshold circuit 2 on the basis of the anticipated but usually only statistically based functional relation between information signal level and noise. The high pass filter plus rectifier augments that control in accordance with the actually existing noise level. It was found that the device provides for still better transfer characteristics as a whole. This is clearly the best mode of operation as the anticipated noise level as provided by the generator 5 may provide for control somewhat on the low side, but without delay, when the expectancy changes because of change in signal level. The actual noise augments that control to match the device to the actual conditions.

Figure 5:
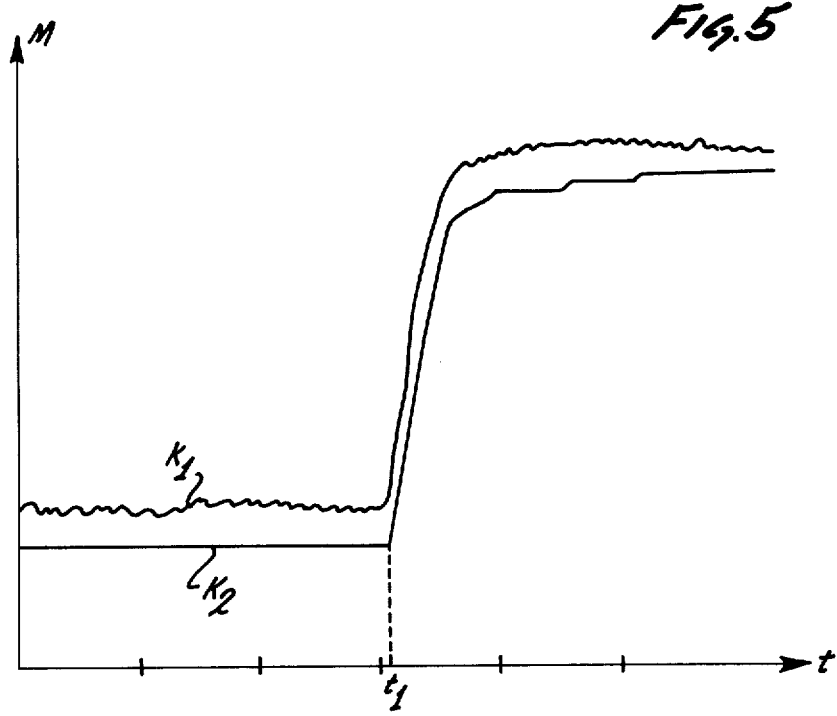
FIG. 5 is a graph for demonstrating the operation of the invention showing signal plotted versus time.

FIG. 5 shows the measuring value M plotted against time $t$ as a representative example. The two curves $K_1$; $K_2$ are plotted to different scales, because they would be more or less superimposed if plotted to the same scale. For example, the curve $K_1$ is shifted up relative to curve $K_2$. Curve $K_1$ represents the current in an ionization chamber as amplified in the conventional manner.

The curve exhibits a definite jitter resulting from statistically distributed noise. The curve $K_2$ has been plotted as the result of processing the ionization chamber current in accordance with the invention. It can readily be seen that the jitter has been eliminated particularly in the first portion of the curve.

The time $t_1$ marks the instant, in which the measuring value jumps, at first to a new level followed by gradually seeking a new (constant) value in accordance with an $e$-function.

The curve $K_2$ tracks the (first) true value of the quantity to be measured without delay. The upper portion of $K_2$ shows then a stepwise change towards the new value because in that region the integration is controlled by the information signal $S_0$ which is generated by the median transfer range of device 2. Specifically, the information component of the difference signal may jump by feedback to a little below the border of ranges $a$ and $b$, and the continued gradual change of the information component in signal I increases the difference signal $S_i$ again until noise peaks become better integratable because they reach range C thereby causing a tracking step. Some moderate integration occurs, of course, already on the one-sided noise pulses in median range $b$, which accounts for the more gradual, but still definite up sloping of $K_2$ between two steps until the final level has been reached.

The output signal 0 can be used to drive analog or digital indicating instruments or to drive plotters or the like. Particularly, for cases in which the processing introduces some delay it is quite advantageous to preprocess the signal as per the invention so as to avoid additional delays. The invention is particularly useful, if the value 0 is used in control and/or feedback circuits.

If the invention is used for measurement of radioactive type radiations, one can use smaller and less intense samples, which in turn is beneficial with regard to protection against radiation.

The invention is not limited to the emobidments described above, but all changes and modifications thereof not constituting departures from the spirit and scope of the invention are intended to be included.

We claim:

1. A circuit for suppressing electrical noise superimposed on a measuring signal, comprising:
   an integrating amplifier producing an integrated output signal;
   a difference forming circuit connected to receive the measuring signal and the integrated output signal and to produce a difference signal equal to their difference;
   a threshold device connected to said difference forming circuit for receiving as an output the difference signal, said threshold device having three gain ranges for each polarity of input signal including a substantially zero gain range for input signals of magnitude less than a first threshold level $a$, an intermediate gain range for signals of magnitude greater than $a$ but less than a second threshold level $b$, and a high gain range for signals of magnitude greater than $b$, said threshold device connected to said integrating amplifier so that the output of said threshold device is the input to said integrating amplifier; and,
   a noise sensing circuit including a high-pass filter and a rectifier, connected to receive the measuring signal as an input and to produce therefrom an output signal representing the magnitude of the noise, said noise sensing circuit connected to said threshold device for controlling at least one of the threshold levels $a$ and $b$ in response to the output signal of said noise sensing circuit.

2. A circuit for suppressing electrical noise superimposed on a measuring signal, comprising:

an integrating amplifier producing an integrated output signal;

a difference forming circuit connected to receive the measuring signal and the integrated output signal and to produce a difference signal equal to their difference;

a threshold device connected to said difference forming circuit for receiving as an input the difference signal, said threshold device having three gain ranges for each polarity of input signal including a substantially zero gain range for input signals of magnitude less than a first threshold level $a$, an intermediate gain range for signals of magnitude greater than $a$ but less than a second threshold level $b$, and a high gain range for signals of magnitude greater than $b$, said threshold device connected to said integrating amplifier so that the output of said threshold device is the input to said integrating amplifier; and, an expected noise anticipating circuit including a function generator connected to receive the measuring signal as an input and to produce therefrom an output signal representing the expected magnitude of the noise, said expected noise anticipating circuit connected to said threshold device for controlling at least one of the threshold levels $a$ and $b$ in response to the output signal of said noise sensing circuit.

* * * * *